United States Patent
Eidson et al.

(10) Patent No.: US 6,529,716 B1
(45) Date of Patent: Mar. 4, 2003

(54) RF TRANSMITTER WITH EXTENDED EFFICIENT POWER CONTROL RANGE

(75) Inventors: Brian Eidson, San Diego, CA (US); Mats Lindstrom, San Diego, CA (US); Robert Edmund Grange, San Diego, CA (US)

(73) Assignee: Skyworks Solutions, Inc., Newport Beach, CA (US)

(*) Notice: Subject to any disclaimer, the term of this patent is extended or adjusted under 35 U.S.C. 154(b) by 0 days.

(21) Appl. No.: 09/482,121

(22) Filed: Jan. 11, 2000

(51) Int. Cl.[7] .............................. H03C 1/62; H04L 27/04
(52) U.S. Cl. ....................... 455/115; 455/108; 455/118; 375/295
(58) Field of Search ................................ 455/108, 113, 455/115, 118, 114; 375/295, 297, 298, 300

(56) References Cited

U.S. PATENT DOCUMENTS

| | | | |
|---|---|---|---|
| 4,758,802 A | | 7/1988 | Jackson |
| 5,055,800 A | | 10/1991 | Black et al. |
| 5,111,162 A | | 5/1992 | Hietala et al. |
| 5,423,082 A | * | 6/1995 | Cygan et al. ............... 375/297 |
| 5,661,434 A | | 8/1997 | Brozovich et al. |
| 6,242,975 B1 | * | 6/2001 | Eidson et al. ............... 375/297 |
| 6,256,482 B1 | * | 7/2001 | Raab ........................ 455/108 |
| 6,266,517 B1 | * | 7/2001 | Fitzpatrick et al. ......... 455/114 |
| 6,286,994 B1 | * | 9/2001 | Boesel et al. ............... 375/295 |
| 2001/0010713 A1 | * | 8/2001 | Yamamoto ................... 375/297 |

OTHER PUBLICATIONS

Brown, M., "Practical Switching Power Supply Design," San Diego: Academic Press, Inc., pp. 9–15, pp. 17–42, pp. 43–65, pp. 67–95, pp. 199–233 (1990).
Candy, J., et al., "Oversampling Methods for A/D and D/A Conversion," Oversampling Delta–Sigma Data Converters—Theory, Design, and Simulation, New York: IEEE Press, pp. 1–25 (1992).
Raab, F., et al., "High–Efficiency Single–Sideband HF/VHF Transmitter Based on Envelope Elimination and Restoration," Radio Systems and Techniques' IEE Conference Publication No. 392, pp. 21–24 (Jul. 4–7, 1994).

* cited by examiner

*Primary Examiner*—Nay Maung
(74) *Attorney, Agent, or Firm*—Thomas, Kayden, Horstemeyer & Risley

(57) ABSTRACT

A highly efficient radio frequency (RF) transmitter provides both wide bandwidth and an extended power control range. The RF transmitter includes stage switching, bias adjustment, and drain supply modulation. These components are used to provide fine and coarse power control and EER envelope fluctuations. The RF transmitter is useful in wireless communications to increase both handset talk time and battery life.

15 Claims, 3 Drawing Sheets

RF TRANSMITTER WITH EXTENDED EFFICIENT POWER CONTROL RANGE

TECHNICAL FIELD

The present invention relates generally to radio frequency (RF) transmitters and, more particularly, to RF transmitters with multiple power level capability.

BACKGROUND OF THE INVENTION

Solid-state amplifiers, such as RF power amplifiers, are widely used for wireless communications. The goal of these power amplifiers is to achieve high operating efficiencies.

Various techniques have been employed to provide multiple power level capability for wireless communications. One technique is to place an attenuator before the power amplifier to reduce the output signal level from the amplifier. Because, however, the power amplifier is configured to operate efficiently only at a specific, typically, peak instantaneous power level, the amplifier's operating efficiency is limited.

Envelope elimination and restoration (EER) power amplifiers have been known for many years. Generally, the efficiency of the EER amplifier is controlled by using circuit elements to modulate a supply voltage. A common EER amplifier topology uses a switching mode power supply to modulate the drain voltage of a single stage RF power amplifier. A pulse width modulator (PWM) feeds the power amplifier. The output of the amplifier is then passed to a low-pass filter, and the filtered output is used to modulate the drain of a MOSFET configured as a single-stage class D RF amplifier. The PWM applies a simple feedback mechanism to shape its output. A conventional EER amplifier only operates at very low bandwidth signals, such as 3–30 kHz, and does not operate efficiently over a wide range of average power output levels. This can contribute to low operating efficiencies. For low bandwidth signals, a conventional EER amplifier also fails to reduce the amount of in-band quantization (i.e., switching) noise in the output signal. The result is that the output signal must be sampled at very high rates, which causes significant losses in the output signal.

SUMMARY OF THE INVENTION

In general, the present invention is directed to a highly efficient RF transmitter including a power amplifier circuit with an extended efficient power control range. The preferred RF transmitter may be configured to operate using a wide variety of communication standards. An RF transmitter implementing the invention is highly efficient for nonconstant-envelope modulation formats and can operate over extended control ranges for high frequency/wide bandwidth operations, such as wireless communications.

In one aspect, the invention is directed to an RF transmitter that includes a signal processing block. A signal input to the signal processing block is up-sampled or interpolated. A supply modulator is coupled to an envelope output signal from the signal processing block, and a quadrature mixer is coupled to constant-envelope outputs from the signal processing block. A power amplifier circuit including a plurality of cascaded amplifiers is coupled to the supply modulator, and an attenuator is coupled between the modulator and the power amplifier circuit.

Implementations of the invention include one or more of the following. The RF transmitter may include switching circuitry configured to bypass one or more of the amplifiers, when the supply modulator operates in a low power mode. The amplifiers may be used to impart a gain to an output signal of the attenuator. The RF transmitter may also include a modulator connected between the envelope output and the supply modulator, where an output of the modulator further includes a high speed binary pulse stream.

In another aspect, the present invention is directed to an RF transmitter that includes a signal processing block responsive to an input signal. A supply modulator receives an envelope output signal from the signal processing block, and a quadrature mixer that receives a two component constant envelope signal from the signal processing block. An attenuator is configured to attenuate the output of the quadrature mixer, and a power amplifier circuit is connected between the attenuator and the supply modulator.

The preferred transmitter has many benefits. The preferred transmitter may be implemented in a wireless handset. This wireless handset may have longer talk times and smaller and lighter batteries. Further, the preferred transmitter reduces the size and cost of the handset and makes the handset more attractive to the wireless customer. The extended efficient power operating range of the transmitter also lengthens the handset's battery life.

The details of one or more embodiments of the invention are set forth in the accompanying drawings and the description below. Other features, objects, and advantages of the invention will be apparent from the description and drawings, and from the claims.

DESCRIPTION OF THE PREFERRED EMBODIMENTS

In general, the present invention is directed to a highly efficient RF transmitter including a power amplifier (PA) circuit with an extended efficient power control range. The RF transmitter may be configured to operate using communication standards, such as the cellular telephone standard IS-95, that operate over a wide bandwidth (e.g., greater than 1 MHz) and an extended power control range (e.g. about 70 dB or more).

In a preferred implementation, a highly efficient envelope elimination and restoration (EER) type power amplifier circuit is used. To achieve high efficiency in this type of power amplifier circuit, a modulated signal is decomposed into a modulation envelope component and a constant-envelope RF component derived from a digital signal phase input from, for example, a baseband integrated circuit (IC). A supply voltage (e.g., the drain voltage for a FET or the collector voltage for a BJT) of the PA circuit is modulated by the modulation envelope signal, and an input of the PA circuit(e.g., the gate for a FET or the base for a BJT) is driven by the constant-envelope RF signal component. For an EER amplifier, the overall operating efficiency is highly dependent on the efficiency of the circuit elements that modulate the supply voltage. This is because the circuitry modulating the supply voltage must process the energy that the RF PA circuit converts to RF energy. In particular, the overall PA circuit efficiency is the product of the supply modulator efficiency and the RF PA circuit efficiency.

Figure 1:
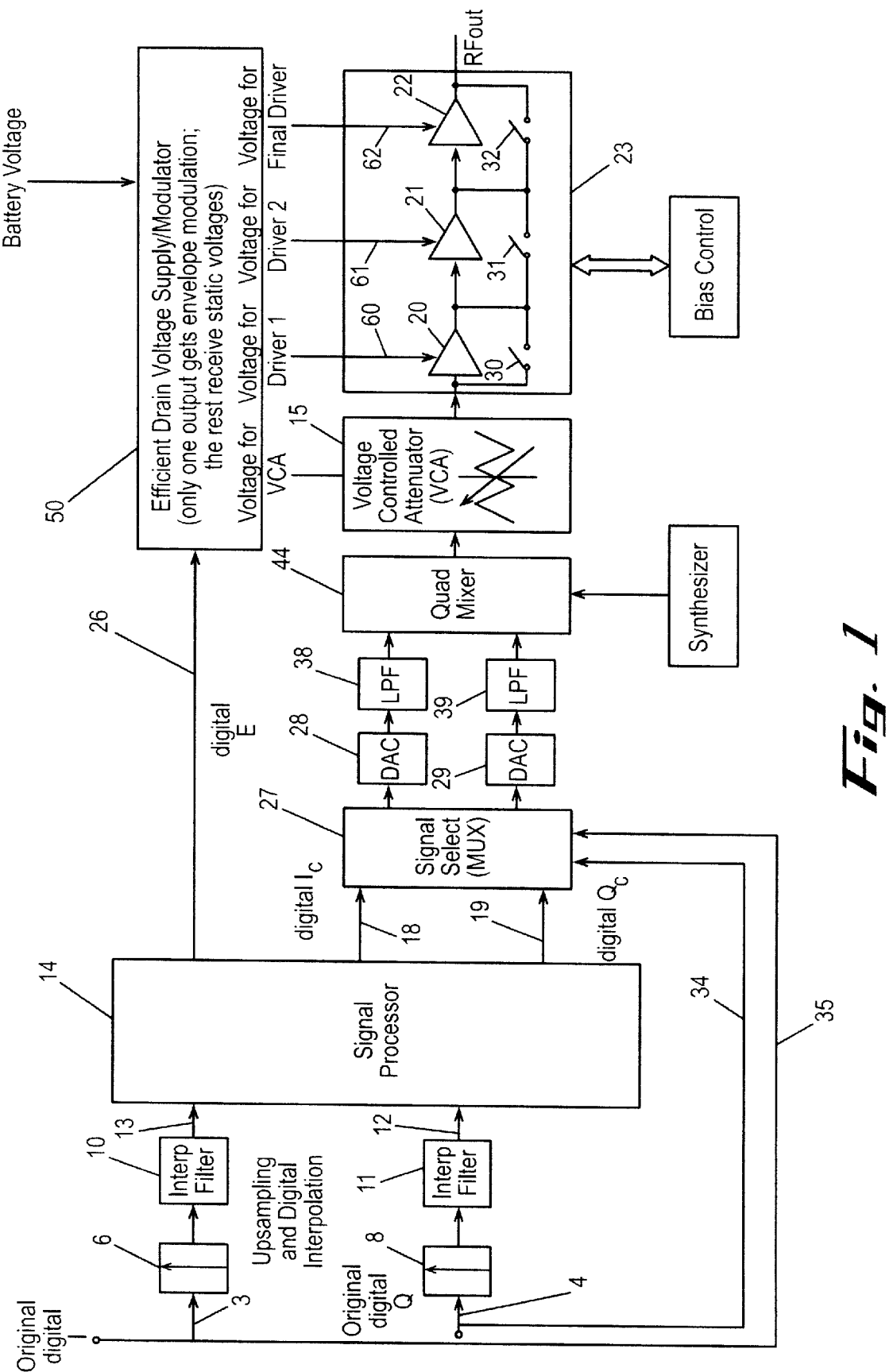
FIG. 1 illustrates one embodiment of a RF transmitter with extended efficient power control range.

FIG. 1 illustrates a highly efficient RF transmitter 1 in a preferred configuration. The transmitter 1 receives digital (i.e. rectangular) in-phase and quadrature input signals 3, 4 arriving, e.g., from a baseband IC (not shown). The input signals 3, 4 are up-sampled by two samplers 6, 8 and digitally interpolated by two interpolation filters 10, 11. The resulting in-phase and quadrature output signals 12, 13 from the filters 10, 11 are then fed into a signal processing block 14. The signal processing block 14 outputs an envelope component signal 26 using polar coordinates. The signal processing block 14 also produces constant envelope component signals 18, 19 representing in-phase (cos θ) and quadrature (sin θ) components derived from the phase portion of the original signals 3, 4.

The constant-envelope signals 18, 19 are delivered to a multiplexer 27, which also receives the original rectangular in-phase and quadrature input signals 3, 4 on two terminals 34, 35. As discussed below, the multiplexer 27 selects either the constant-envelope signals 18, 19 or the signals on the input terminals 34, 35 and delivers the selected signals to two digital-to-analog converters (DACs) 28, 29, as discussed below. The selected signals then pass through two low pass filters 38, 39 and eventually arrive at a quadrature mixer 44. The output of the quadrature mixer 44 passes through a voltage controlled attenuator (VCA) 15 that nominally introduces little or no loss to the signals. The output of the VCA 15 is then fed into a power amplifier circuit 23.

The samplers 6, 8 are used to convert the in-phase and quadrature input signals 3, 4 to constant-envelope representations. This is because the constant-envelope signal components 18, 19 have very wide bandwidths. For example, the constant-envelope signals 18, 19 often have bandwidths that are about 6 to 8 times wider than the bandwidths of the input signals 3, 4. In some embodiments, interpolation is performed on the input signals 3, 4 to minimize the occurrence of ripples in the resulting composite constant-envelope signals. Ripples are 25 undesirable because they tend to cause AM/PM (amplitude modulation-to-phase modulation) and AM/AM distortion in the transmitter 1, when recombination with the envelope signal occurs.

In the illustrated embodiment, the power amplifier circuit 23 is a three-stage power amplifier circuit including first and second cascaded driver amplifiers 20, 21 and an 30 additional output stage amplifier 22.

The first-stage driver amplifier 20 includes a drain input terminal 60 and a switch 30. The second stage driver amplifier 21 also includes a drain input terminal 61 and a switch 31. The output stage amplifier 22 also includes a drain input terminal 62 and a switch 32. Each of the amplifiers 20, 21, 22 is used to impart gain to the output signal 17 from the voltage controlled attenuator (VCA) 15.

In FIG. 1, the signal processing block 14 delivers the envelope signal 26 to a supply modulator 50 through a delta-sigma digital-to-analog (D/A) converter (not shown). The supply modulator 50 is connected to the drain input terminals 60, 61, 62.

Figure 2:
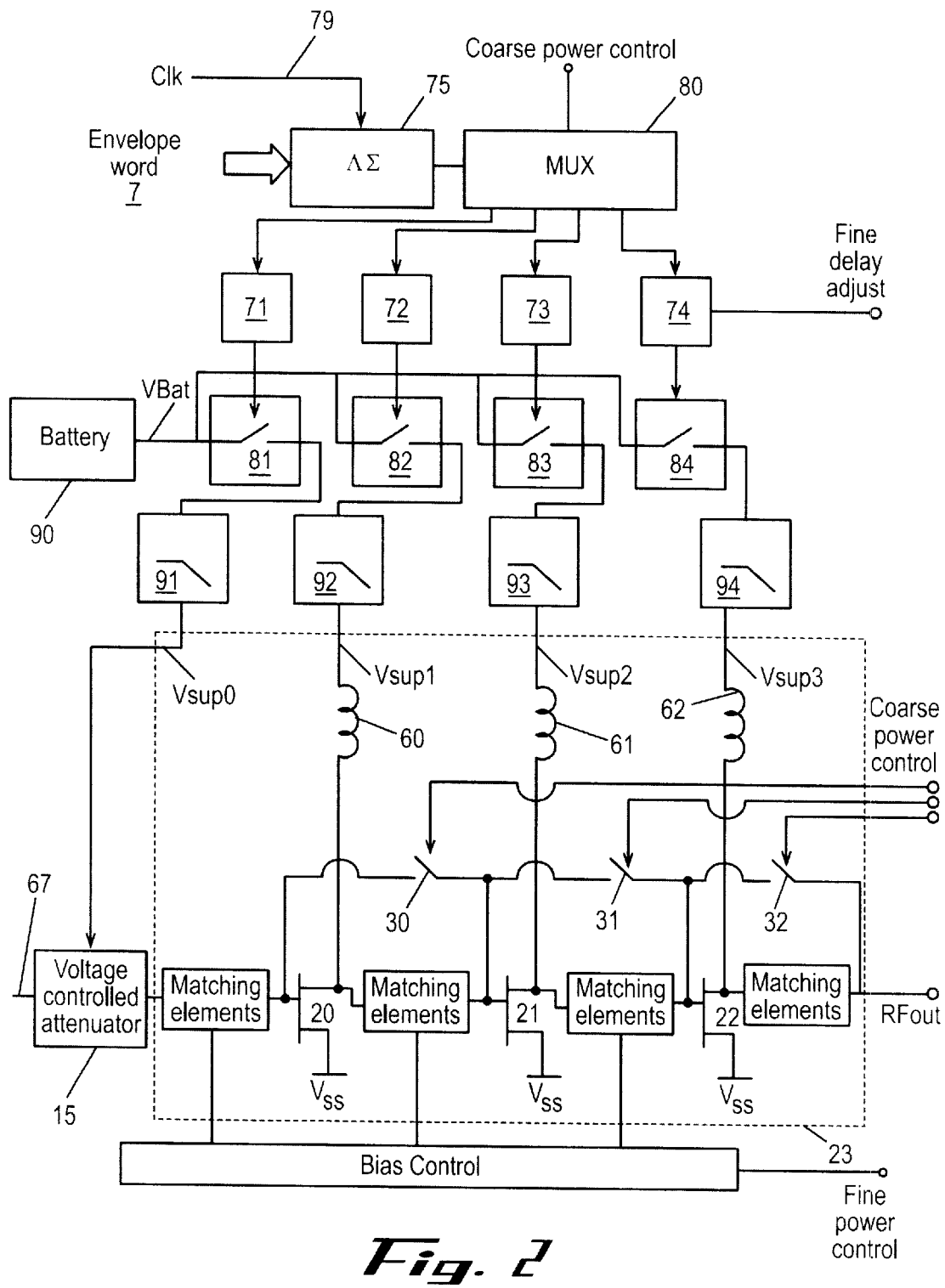
FIG. 2 illustrates a supply modulator for the RF transmitter of FIG. 1.

FIG. 2 shows the supply modulator 50 in more detail. The supply modulator 50 includes a delta-sigma (Δ-Σ) modulator 75 having a clock input 79. The Δ-Σ modulator 75 receives the digital envelope component signal 7 from the signal processing block 14 and up-samples and Δ-Σ modulates this signal. The envelope component signal 7 provided to the Δ-Σ modulator 75 is usually a multi-bit envelope word fed through a delta-sigma D/A converter (not shown). The modulator 75 outputs a high speed binary pulse stream that is delayed for time alignment with the output signal 67 from the quadrature mixer 44. The output signal from the Δ-Σ modulator 75 is then delivered to the multiplexer 80 and filtered and presented to the driver amplifiers 20, 21 and output stage amplifier 22, as described below. The multiplexer 80 provides input to delay lines 71–74. Each of the delay lines 71–74 connects to a corresponding one of several switching transistors 81–84. The switching transistors 81–84 each supply a selected current level to one of several low-pass filters 91–94. This causes the digital signals from the above generated pulse stream to be converted to analog drain voltages to be fed to the drain terminals 60, 61, and 62.

The delay lines 71–74 are used to achieve precise time alignment of the envelope component signal 26 and the phase component signal 8 throughout the transmitter 1.

When one of the driver amplifiers 20, 21 or the output stage amplifier 22 is in a non-modulated mode, a static voltage is supplied to the input drain terminal of that power amplifier by a device, such as a battery 90. The corresponding switching transistor 81–84 remains closed.

Figure 3:
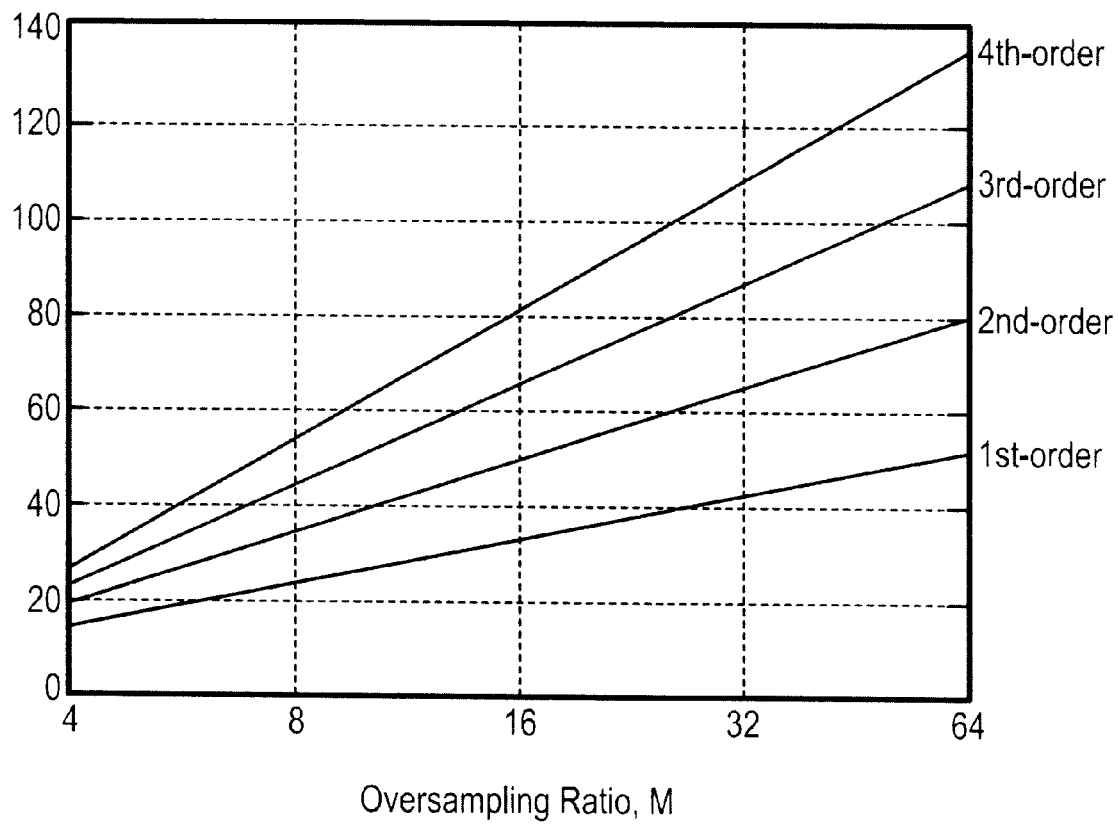
FIG. 3 illustrates a graph of the oversampling ratio versus signal-to-noise (SNR) ratio for a one bit delta-sigma modulator.

In certain embodiments, the Δ-Σ modulator 75 is a delta-sigma Pulse Density Modulator (PDM) converter. This PDM converter can be used to transform the envelope component signal 18 into one-bit, high-rate samples. FIG. 3 shows that the oversampling rate depends on the order of the converter and the desired signal-to-quantization noise of the resulting signal. These modulators also push the majority of the quantization noise of the envelope component signal 18 outside of the operating bandwidth, where it can be filtered away.

To operate at average low power control levels at about 30 dB below the maximum output power level of the transmitter 1, each of the amplifiers 20, 21, and 22 is bypassed. The switches 30, 31, and 32 are closed to create a single path around the amplifiers 20, 21, and 22. The output from the modulator 40 is actively attenuated to a desired average output level by the VCA 15. The output of the VCA 15 is then sent directly to an antenna (not shown) via the output of the power amplifier circuit 23. In this configuration, the multiplexer 27 selects the signals on the input terminals 34 and 35, which correspond to the in-phase and quadrature input signals 3, 4. This allows lower sampling rates, since the transmission power level at the VCA 15 is low. This also allows the samplers 6, 8 and the filters 10, 11 to be switched-off to conserve power.

In some situations, unwanted noise occurs when the multiplexer 27 switches between the original input signals 3, 4 and the constant-envelope signals 18, 19. This, in turn, produces unwanted spurious signals at the output of power amplifier circuit 23. However, switching the transmitter 1 at mid-I-symbol using quantization codes allows the signals to pass through the DACs 28, 29 at substantially the same rate. As a result, the time required by the amplifiers 20, 21, 22 to process the signal from the VCA 15 is substantially the same, and no delay in signal processing occurs.

The cascaded driver amplifiers 20, 21 and output stage amplifier 22 allow the transmitter 1 to also operate at maximum average power, which may be about 30 dBm for the IS-95 communication standard. However, for efficient power control with sufficient linearity over the 30 dB power control range, bypassing of the driver amplifiers 20, 21 and the output stage amplifier 22 in stages is necessary. This is because envelope restoration through drain modulation and variable gate biasing of the driver circuits 40, 41, 42 is linear for a single stage of the power amplifier circuit 23 only for a limited range of gains. This range may be about 6–20 dB.

The bypassing of one or more driver amplifiers 20, 21 or the output stage amplifier 22 is as follows. Generally, to bypass the driver amplifiers 20, 21 and the output stage amplifier 30 22, one or more of the switches 30, 31, 32 are closed to create a single path around the amplifiers 20, 21, and 22. As a result, the output amplifier stage 22 is shut off and an attenuation of around 10 dB below the maximum output level of the transmitter 1 is imparted by bypassing the output amplifier stage 22 through disconnecting the drain terminal 62. As a result, the driver circuit 41 can be drain modulated through the drain terminal 61 to superimpose the AM modulation to the constant-envelope output signal 18 from the driver circuit 40. To impart an attenuation of about 20 dB below the maximum output level, the output stage amplifier 22 and the second stage amplifier 21 can be bypassed through disconnecting the drain terminals 62 and 61, respectively. To impart an attenuation of about 30 dB below the maximum output level, the drain terminals 62, 61, and 60 can be disconnected to bypass the amplifiers 22, 21, and 20 below the maximum output level, respectively. Switching in this manner increases the power output level in increments of about 10 dB, which provides for coarse power control. Fine power control (e.g., sub-dB increments) can be achieved by adjusting the DC operating level of the output-stage power amplifier 22. Fine power control may also be achieved by fine tuning any of the drain bias signals via drain terminals 60, 61, and 62 from supply modulator 50.

The transmitter 1 shown here is also capable of operating at over 30–50 dB of the power control range, depending upon the input signals 3, 4. As a result, constant-envelope signals can be fed to the antenna via the power amplifier circuit 23 without analog processing and envelope shaping by the VCA 15. This results in a transmitter 1 that is more robust over normal temperature, voltage, and manufacturing variations. Moreover, the quadrature mixer 40 used in the transmitter 1 is well-suited for constant envelope signals, and thus, is more easily manufactured and used than the mixers found in conventional amplifiers.

The preferred transmitter is useful in wireless communications. Transforming the envelope signal into high rate one-bit representations can be achieved because the original signals are digital and the envelope signal at the signal processing block can be easily calculated using, for example, a look-up table. Further, the preferred transmitter can easily operate over extended control ranges using baseband constant envelope signals or the original rectangular components. For low nominal power settings, the VCA is optimally designed to deliver a quadrature modulated representation of the original rectangular component signals. At higher nominal power settings, the VCA can pass the constant envelope signals without significant attenuation. In this way, lower sampling rates and power levels are possible. For higher power levels, a coarse power control can be achieved by simply bypassing each of the amplifiers of the power amplifier circuit.

A number of embodiments of the present invention have been described. Nevertheless, it will be understood that various modifications may be made without departing from the spirit and scope of the invention. Accordingly, other embodiments are within the scope of the following claims.

What is claimed is:

1. A radio frequency (RF) transmitter, comprising:
    a signal processing block responsive to an up-sampled or interpolated signal;
    a supply modulator responsive to an envelope output signal from the signal processing block;
    a quadrature mixer responsive to a phase output signal from the signal processing block;
    a power amplifier circuit coupled to the supply modulator; and
    an attenuator coupled between the modulator and the power amplifier circuit.

2. The RF transmitter of claim 1, wherein the power amplifier circuit comprises a plurality of driver amplifiers, where each of the driver amplifiers has a switch, and a drain input terminal.

3. The RF transmitter of claim 2, wherein each switch is configured for bypassing an associated amplifier.

4. The RF transmitter of claim 2, wherein each of the amplifiers imparts a gain to an output signal of the attenuator.

5. The RF transmitter of claim 2, wherein the plurality of amplifiers are cascaded such that each amplifier forms a stage of the power amplifier circuit.

6. The RF transmitter of claim 2, wherein the supply modulator is configured to drain-bias each amplifier through its respective drain input terminal.

7. The RF transmitter of claim 2, wherein the supply modulator includes a modulator responsive to the constant envelope output signal from the signal processing block for generating an output characterized by a high speed binary pulse stream.

8. The RF transmitter of claim 7, wherein the supply modulator, comprises:
    a multiplexer configured to receive a signal from the modulator;
    a plurality of delay lines connected to the multiplexer and associated ones of the switches of the amplifiers; and
    a plurality of filters connected to corresponding ones of the switches and the drain input terminals, wherein a modulated signal is delivered to selected ones of the amplifiers.

9. The RF transmitter of claim 1, wherein the attenuator modulates an output of the supply modulator during low power operations.

10. The RF transmitter of claim 1, further comprising a multiplexer connected between the signal processing block and the quadrature mixer, the multiplexer being operable to select between the input signal before or after the one of up-sampling and interpolating.

11. The RF transmitter of claim 1, wherein the signal processing block converts the input signal having rectangular coordinates into an output signal having polar coordinates.

12. The RF transmitter of claim 1, wherein the RF transmitter forms a portion of a handset for wireless communications.

13. A radio frequency (RF) transmitter, comprising:
    a signal processing block responsive to an input signal;
    a supply modulator coupled to the signal processing block to receive an envelope output signal;
    a quadrature mixer coupled to the signal processing block to receive a two component constant envelope signal;
    an attenuator configured to attenuate the output of the quadrature mixer; and
    a power amplifier circuit coupled between the attenuator and the supply modulator.

14. The RF transmitter of claim 13, wherein the power amplifier circuit imparts a gain to an output signal of the attenuator.

15. The RF transmitter of claim 13, wherein the supply modulator is configured to bypass the power amplifier circuit during low power operations.

* * * * *